(12) United States Patent
Ye et al.

(10) Patent No.: US 10,145,526 B2
(45) Date of Patent: Dec. 4, 2018

(54) HEADLAMP MODULE

(71) Applicant: HARVATEK CORPORATION, Hsinchu (TW)

(72) Inventors: Zhi-Ting Ye, Hsinchu (TW); Shyi-Ming Pan, Hsinchu (TW); Chia-Hung Pan, Hsinchu (TW)

(73) Assignee: HARVATEK CORPORATION, Hsinchu (TW)

( * ) Notice: Subject to any disclaimer, the term of this patent is extended or adjusted under 35 U.S.C. 154(b) by 82 days.

(21) Appl. No.: 15/433,020

(22) Filed: Feb. 15, 2017

(65) Prior Publication Data

US 2018/0031193 A1    Feb. 1, 2018

(30) Foreign Application Priority Data

Jul. 26, 2016   (TW) .............................. 105211295 A
Oct. 24, 2016   (TW) .............................. 105134339 A

(51) Int. Cl.
*F21S 45/47* (2018.01)
*H01L 33/00* (2010.01)
(Continued)

(52) U.S. Cl.
CPC ........... *F21S 41/141* (2018.01); *F21S 41/192* (2018.01); *F21S 45/47* (2018.01); *H01L 25/0753* (2013.01); *H01L 33/486* (2013.01); *H01L 33/502* (2013.01); *H01L 33/60* (2013.01); *H01L 33/62* (2013.01); *H01L 33/641* (2013.01)

(58) Field of Classification Search
CPC .... F21S 41/141; F21S 41/192; F21S 48/1109; F21S 48/115; H01L 25/07531; H01L 33/486; H01L 33/502; H01L 33/60; H01L 33/62; H01L 33/641
See application file for complete search history.

(56) References Cited

U.S. PATENT DOCUMENTS

2008/0310158 A1*  12/2008  Harbers ................... F21K 9/54
                                                        362/240
2016/0139328 A1*  5/2016  Hikmet ................ G02B 6/0035
                                                         362/84

(Continued)

FOREIGN PATENT DOCUMENTS

CN        102168814 B      2/2016
WO        2016/012293 A1   1/2016

*Primary Examiner* — Anabel Ton
(74) *Attorney, Agent, or Firm* — Chieh-Mei Wang

(57) ABSTRACT

A headlamp module comprises a connecting base, a substrate, and at least two edge-type light emitting diode (LED) units. The at least two edge-type LED units are mounted to opposite surfaces of the substrate facing away from each other. Each edge-type LED unit comprises an LED chip, a wavelength converting layer, and a light reflecting layer. The LED chip comprises a bottom surface, a light emitting surface facing away from the bottom surface, and first sidewalls. The wavelength converting layer covers the light emitting surface and the first sidewalls. The wavelength converting layer converts emitted light to a desired range of wavelengths. The light reflecting layer reflects the converted light toward the second sidewalls, thus expanding the angle and brightness of light around the headlamp module and avoiding an unlit or dark area immediately around the headlamp module.

7 Claims, 3 Drawing Sheets

(51) Int. Cl.
*F21S 41/141* (2018.01)
*H01L 25/075* (2006.01)
*H01L 33/48* (2010.01)
*H01L 33/62* (2010.01)
*H01L 33/50* (2010.01)
*H01L 33/60* (2010.01)
*H01L 33/64* (2010.01)
*F21S 41/19* (2018.01)

(56) References Cited

U.S. PATENT DOCUMENTS

| | | | |
|---|---|---|---|
| 2016/0146415 A1* | 5/2016 | Suzuki | F21S 48/1145 362/553 |
| 2016/0259116 A1* | 9/2016 | Van Bommel | G02B 6/0003 |
| 2016/0377785 A1* | 12/2016 | Chestakov | G02B 19/0066 362/606 |

* cited by examiner

HEADLAMP MODULE

CROSS-REFERENCE TO RELATED APPLICATIONS

This application claims all benefits accruing under 35 U.S.C. § 119 from Taiwan Patent Application No. 105211295, filed on Jul. 26, 2016 and Taiwan Patent Application No. 105134339, filed on Oct. 24, 2016, the content of which is hereby incorporated by reference.

FIELD

The present disclosure relates to vehicle lighting, and more particularly to a headlamp module.

BACKGROUND

Light emitting diode (LED), as an efficient light source, presents many advantages such as environmental friendly, energy saving, and long lasting, which has been widely used in various fields. Solid-state LED light source is capable of generating higher brightness than incandescent lamps and fluorescent lamps and is used more extensively for automotive lighting.

Generally, a headlamp module includes an LED light source, a reflector, and a projection lens. The LED light source includes at least one LED assembly. The LED assembly has a light emitting surface. The reflector is located outside the LED assembly, and the reflector faces the light emitting surface of the LED assembly. The reflector has a plurality of reflecting surfaces with different curvatures to reflect light from the LED assembly to different directions. The projection lens is configured for projecting the reflected light to outside a vehicle. Compared to incandescent lamps and fluorescent lamps that emit relatively divergent light, light emitted by the LED assembly shows strong directionality and a majority of the emitted light is vertical to the light emitting surface of the LED assembly. Therefore, an area lightened by the reflected light from the reflector is limited. Upon using such LED assembly for automotive lighting, it is liable to form a dark or unlit area around the headlamp module, and such lighting effect affects applications of the headlamp module. Moreover, a structure of such headlamp module is complicated and of high assembly difficulty and cost.

BRIEF DESCRIPTION OF THE DRAWINGS

The present disclosure is illustrated by way of embodiments and accompanying drawings.

DETAILED DESCRIPTION

Figure 1:
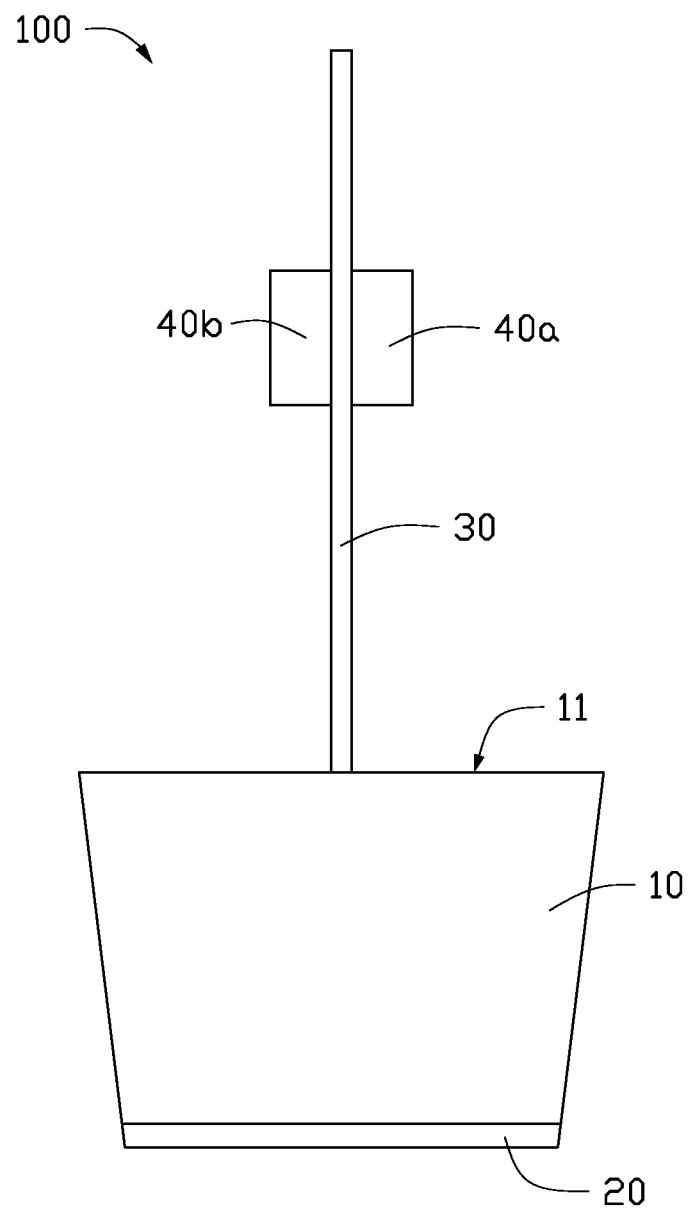
FIG. 1 is a schematic structural view of a lamp module of an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented. The term "substantially" means essentially conforming to the particular dimension, shape, or other feature that the term modifies, such that the component need not be exact. For example, "substantially cylindrical" means that the object resembles a cylinder, but may have one or more deviations from a true cylinder. The term "coupled" means connected, whether directly or indirectly through intervening components, and is not necessarily limited to physical connections. The connection may be such that the objects are permanently connected or releasably connected. The term "connecting" is defined as linked, whether directly or indirectly through intervening components, and is not necessarily limited to physical linking. The connection can be such that the objects are permanently connected or releasably connected. The term "comprising" or "containing" when utilized, means "including, but not necessarily limited to"; it specifically indicates open-ended inclusion or membership in the so-described combination, group, series and the like.

Figure 2:
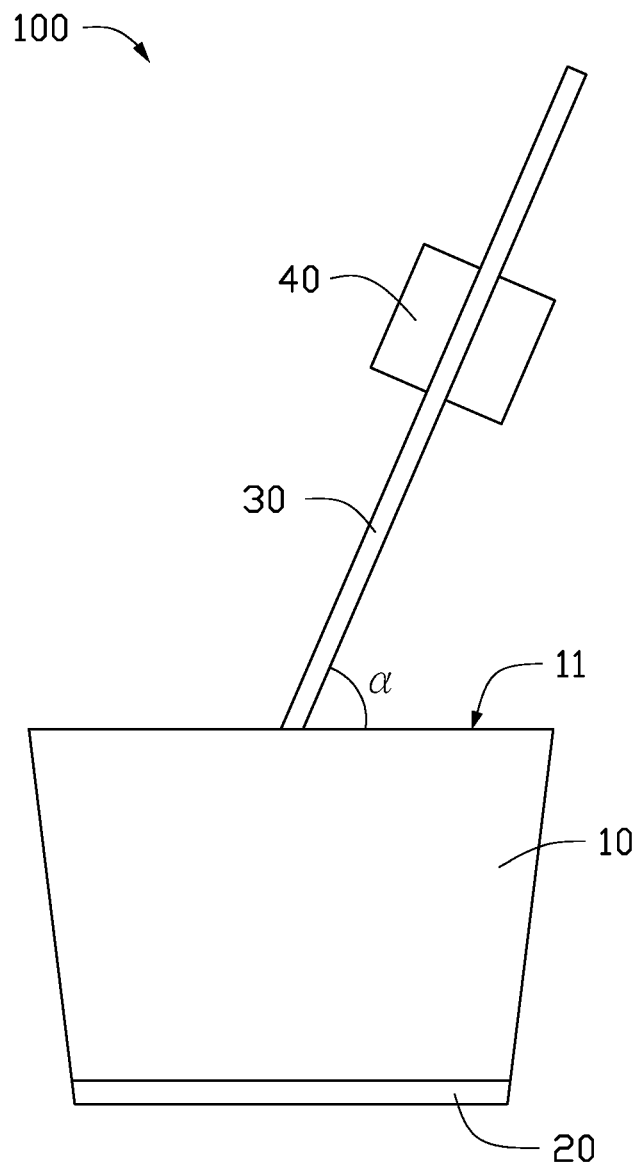
FIG. 2 is a schematic structural view of a lamp module of another exemplary embodiment of the present disclosure.

FIG. 1 and FIG. 2 show exemplary embodiments of a headlamp module 100 of the present disclosure. The headlamp module 100 includes a connecting base 10, an electrical connection 20, a substrate 30, and at least two edge-type light emitting diode (LED) units 40. The connecting base 10 has a bottom part and a top part, and the bottom part is away from the top part. The electrical connection 20 connects to the bottom part of the connecting base 10, and the substrate 30 connects to the top part of the connecting base 10.

The electrical connection 20 may be electrically coupled to an external power supply (not shown).

The connecting base 10 may be made of copper. The connecting base 10 has a mounting surface 11, and the mounting surface 11 faces away from the electrical connection 20.

The substrate 30 has a bottom end, and the bottom end connects to a substantially central position of the mounting surface 11. The substrate 30 protrudes from the mounting surface 11 in a direction away from the connecting base 10. In the embodiment shown in FIG. 1, the substrate 30 is substantially flat and is vertical to the mounting surface 11. In another embodiment, shown in FIG. 2, an angle α is defined between the substrate 30 and the mounting surface 11, and the angle α is in a range of 1 to 45 degrees.

The at least two edge-type LED units 40 are respectively mounted on two surfaces of the substrate 30 and the at least two edge-type LED units 40 are electrically coupled to the substrate 30. The two surfaces are on opposite sides of the substrate 30 and face away from one another. In the embodiment shown in FIG. 1, one edge-type LED unit 40a is mounted on a side of the substrate 30, while another edge-type LED unit 40b is mounted on an opposite side of the substrate 30. Thus, the two edge-type LED units 40a and 40b face away from one another. The substrate 30 further includes a driver (not shown) electrically coupled to the at least two edge-type LED units 40. The driver is configured for connecting the external power supply to the at least two edge-type LED units 40 through the electrical connection 20 and the substrate 30, to provide electric power to the at least two edge-type LED units 40 for lighting. In the present embodiments, the substrate 30 is made of a heat dissipating material such as aluminum or ceramic in order to draw heat away from the at least two edge-type LED units 40.

Figure 3:
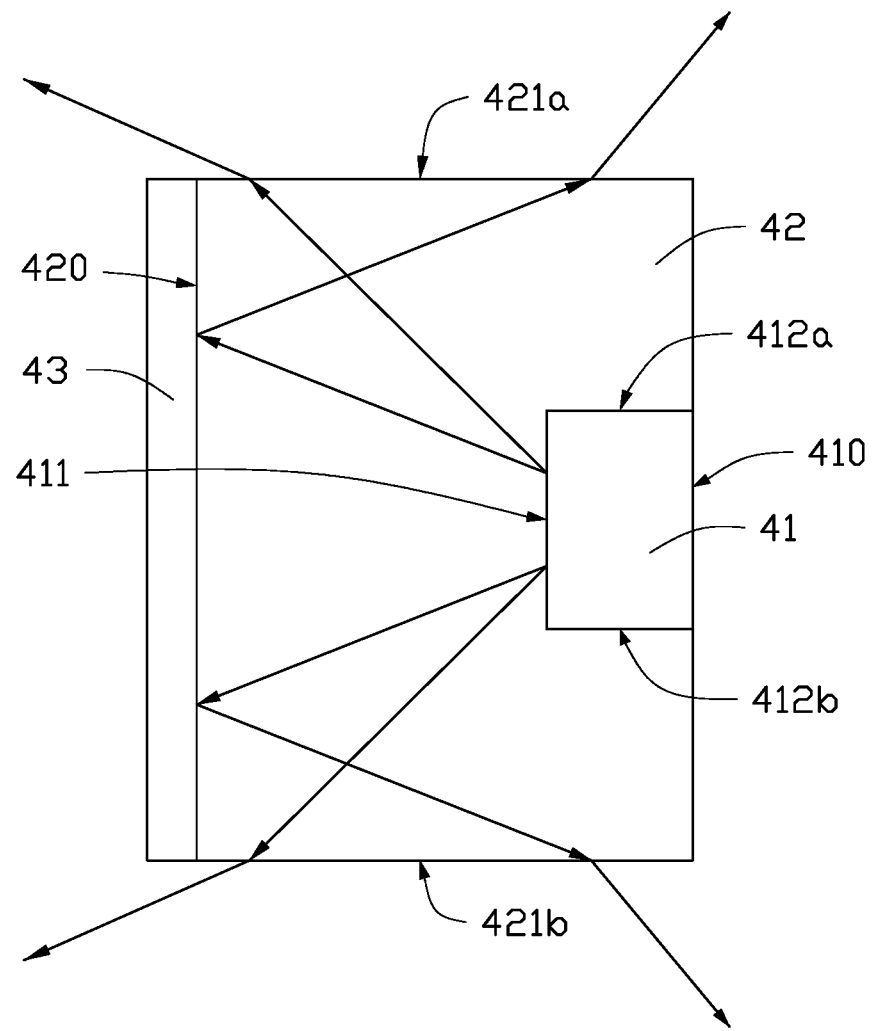
FIG. 3 is a schematic structural view of an edge-type light emitting diode unit of the lamp module in FIG. 1 and FIG. 2.

The at least two edge-type LED units 40 may be fabricated as a Chip Scale Package (CSP). FIG. 3 shows an exemplary embodiment of the edge-type LED unit 40. Each of the at least two edge-type LED units 40 includes an LED chip 41, a wavelength converting layer 42, and a light reflecting layer 43. The LED chip 41 has a bottom surface 410, a light emitting surface 411, and first sidewalls 412. The bottom surface 410 and the light emitting surface 411 are on opposite sides of the LED chip 41 facing away from one another. The first sidewalls 412 connect the bottom surface 410 and the light emitting surface 411. The wavelength converting layer 42 covers the light emitting surface 411 and the first sidewalls 412. The wavelength converting layer 42 has a top surface 420 and second sidewalls 421. The top surface 420 faces toward the light emitting surface 411, and the second sidewalls 421 face toward the first sidewalls 412. In the embodiment shown in FIG. 3, the first sidewalls 412 include at least two sidewalls 412a and 412b. The second sidewalls 421 include at least two second sidewalls 421a and 421b, the second sidewall 421a faces toward the first sidewall 412a, and the second sidewall 421b faces toward the first sidewall 412b. The light reflecting layer 43 is located on the top surface 420 of the wavelength converting layer 42. Each of the at least two edge-type LED units 40 is mounted on a surface of the substrate 30 via the bottom surface 410 of the LED chip 41.

The LED chip 41 emits light through the light emitting surface 411. The wavelength converting layer 42 converts the emitted light from the LED chip 41 to light with a specific range of wavelengths. The light reflecting layer 43 reflects the converted light toward the second sidewalls 421 of the wavelength converting layer 42, thus the reflected light is transmitted through the second sidewalls 421. In the present embodiments, the wavelength converting layer 42 is made of a fluorescent material.

Light from each of the at least two edge-type LED units 40 is thus emitted through the second sidewalls 421 of the wavelength converting layer 42. Considering the at least two edge-type LED units 40 are mounted on opposite sides of the substrate 30 facing away from one another, light emitted from the headlamp module 100 that includes the at least two edge-type LED units 40 provide even lighting of the two opposite sides of the substrate 30, a lighting scope of almost 360 degrees and increased lighting angle is achieved. The disclosed headlamp module 100 presents a simple structure, thereby reducing the manufacturing cost.

In the present embodiments, the headlamp module 100 includes two edge-type LED units 40, which are located on two opposite surfaces of the substrate 30 facing away from each other. In other embodiments, the number of the edge-type light emitting diode units 40 may be more than two. For example, each surface of the substrate 30 may have a plurality of the edge-type light emitting diode units 40 and the plurality of the edge-type light emitting diode units 40 may be arranged in a matrix. The edge-type LED units 40 are dispersed on the substrate 30, for better dispersion of the heat generated by the edge-type LED units 40.

The headlamp module of the present disclosure may be applied in automotive lighting system, which may expand the angle and brightness of light around the headlamp module and reduce unlit or dark areas immediately around the headlamp module.

The embodiments illustrated and described above are only examples of the present disclosure, which should not be considered as a limitation to the scope of the present disclosure. Many changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A headlamp module, comprising:
 a connecting base, a substrate, and at least two edge-type light emitting diode (LED) units; wherein the connecting base comprises a mounting surface, the substrate comprises a bottom end connected to the mounting surface; wherein the substrate protrudes in a direction away from the mounting surface, and the substrate comprises two surfaces facing away from each other; wherein the at least two edge-type light emitting diode (LED) units are electrically coupled to the substrate, the at least two edge-type LED units comprises a first edge-type light emitting diode unit and a second edge-type LED unit, the first edge-type LED unit is mounted on one of the two surfaces of the substrate, the second edge-type light LED is mounted on another one of the two surfaces of the substrate; and each of the at least two edge-type LED units comprises:
 a LED chip comprising a bottom surface, a light emitting surface, and at least two first sidewalls, the bottom surface and the light emitting surface facing away from each other, the first sidewalls connecting the bottom surface and the light emitting surface, the bottom surface of the LED chip being mounted on one of the two surfaces of the substrate, and the LED chip emitting light through the light emitting surface;
 a wavelength converting layer covering the light emitting surface and the first sidewalls of the LED chip, the wavelength converting layer comprising a top surface and at least two second sidewalls, the top surface facing toward the light emitting surface, the second sidewalls facing toward the first sidewalls respectively, and the wavelength converting layer converting the emitted light from the LED chip to light with a specific range of wavelengths; and
 a light reflecting layer on the top surface of the wavelength converting layer, the light reflecting layer reflecting the converted light toward the second sidewalls of the wavelength converting layer, and the reflected light being emitted through the second sidewalls.

2. The headlamp module of claim 1, wherein the wavelength converting layer is made of a fluorescent material.

3. The headlamp module of claim 1, wherein the substrate is substantially flat and the substrate is vertical to the mounting surface.

4. The headlamp module of claim 1, wherein the substrate is substantially flat, an angle is defined between the substrate and the mounting surface, and the angle is in a range of about 1 to about 45 degrees.

5. The headlamp module of claim 1, wherein the substrate is made of aluminum or ceramic.

6. The headlamp module of claim 1, wherein a number of the at least two edge-type LED units is two, one edge-type light emitting diode unit is mounted on one of the two surfaces of the substrate, and another edge-type LED unit is mounted on another one of the two surfaces of the substrate.

7. The headlamp module of claim 1, wherein a plurality of the edge-type light emitting diode units is on each surface of the substrate.

* * * * *